(12) United States Patent
Yi

(10) Patent No.: US 10,868,259 B2
(45) Date of Patent: Dec. 15, 2020

(54) METHOD FOR MANUFACTURING OLED LIGHT-EMITTING MATERIAL

(71) Applicant: WUHAN CHINA STAR OPTOELECTRONICS SEMICONDUCTOR DISPLAY TECHNOLOGY CO., LTD., Hubei (CN)

(72) Inventor: Guoxia Yi, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 298 days.

(21) Appl. No.: 16/091,116

(22) PCT Filed: Aug. 31, 2018

(86) PCT No.: PCT/CN2018/103391
§ 371 (c)(1),
(2) Date: Oct. 4, 2018

(87) PCT Pub. No.: WO2019/227735
PCT Pub. Date: Dec. 5, 2019

(65) Prior Publication Data
US 2019/0372018 A1    Dec. 5, 2019

(51) Int. Cl.
*H01L 51/00* (2006.01)
*C09K 11/06* (2006.01)
*H01L 51/50* (2006.01)

(52) U.S. Cl.
CPC .......... *H01L 51/0072* (2013.01); *C09K 11/06* (2013.01); *C09K 2211/1007* (2013.01);
(Continued)

(58) Field of Classification Search
CPC . H01L 51/0072; H01L 51/5012; C09K 11/06; C09K 2211/1007; C09K 2211/1018
See application file for complete search history.

(56) References Cited

U.S. PATENT DOCUMENTS 10,069,096 B1    9/2018  Xu
10,297,795 B2 *  5/2019  Xu ..................... H01L 51/5072
(Continued)

FOREIGN PATENT DOCUMENTS

CN    101222802 A    7/2008
CN    102659846 A    9/2012
(Continued)

*Primary Examiner* — C Melissa Koslow
(74) *Attorney, Agent, or Firm* — Mark M. Friedman

(57) ABSTRACT

The present disclosure provides a method for manufacturing an organic light-emitting diode (OLED) light-emitting material. The method includes providing a host light-emitting material, a dopant light-emitting material, a first solvent, and a second solvent; mixing the host light-emitting material with the first solvent to form a first solution; mixing the dopant light-emitting material with the second solvent to form a second solution; mixing the first solution with the second solution to form a mixed solution; and performing an after-treatment for the mixed solution to obtain the OLED light-emitting material.

13 Claims, 2 Drawing Sheets

(52) U.S. Cl.
CPC .. *C09K 2211/1018* (2013.01); *H01L 51/0008* (2013.01); *H01L 51/5012* (2013.01)

(56) References Cited

U.S. PATENT DOCUMENTS

| | | |
|---|---|---|
| 2008/0182126 A1 | 7/2008 | Fukuda et al. |
| 2016/0005971 A1 | 1/2016 | Li |
| 2018/0351125 A1 | 12/2018 | He et al. |

FOREIGN PATENT DOCUMENTS

| | | |
|---|---|---|
| CN | 102867920 A | 1/2013 |
| CN | 103413893 A | 11/2013 |
| CN | 103474584 A | 12/2013 |
| CN | 105870347 A | 8/2016 |
| CN | 107403870 A | 11/2017 |
| WO | WO 2018/184264 | * 10/2018 |

* cited by examiner

METHOD FOR MANUFACTURING OLED LIGHT-EMITTING MATERIAL

FIELD OF INVENTION

The present disclosure relates to the field of OLED display, and more particularly to a method for manufacturing an organic light-emitting diode (OLED) light-emitting material.

BACKGROUND

Generally, an organic light-emitting diode (OLED) includes an anode, a hole injection layer, a hole transport layer, a light-emitting layer, an electron transport layer, an electron injection layer, and a cathode. Since concentration quenching occurs in a light-emitting layer of an OLED (i.e., light-emitting efficiency will decrease if concentration of light-emitting material is increased), using a single one light-emitting material to form a light-emitting layer of an OLED would adversely have light-emitting material have low light-emitting efficiency. Thus, in the prior art, a light-emitting layer of OLED is formed from a host material (host light-emitting material) and a dopant material (dopant light-emitting material) using vapor deposition. Doping percentage of the dopant material is determined based on whether such percentage can maximize light-emitting efficiency of the light-emitting layer. However, during vapor deposition of light-emitting materials, flight of gasified atoms or molecules causes unbalanced ratio of dopant material to host material. This results in change of doping ratio of dopant material to host material in the original light-emitting materials, and thus lowers light-emitting efficiency of light-emitting layer.

Therefore, there is a need to provide a method for manufacturing an OLED light-emitting material to solve unbalanced ratio problems during vapor deposition of light-emitting materials.

SUMMARY OF DISCLOSURE

The present disclosure provides a method for manufacturing an organic light-emitting diode (OLED) light-emitting material. The present disclosure solves the problems in the prior art, where during vapor deposition of light-emitting materials, unbalanced ratio of dopant material to host material is caused, doping ratio of dopant material to host material in the original light-emitting materials is changed, and light-emitting efficiency of light-emitting layer is lowered.

To achieve the above-said objective, the present disclosure provides the following technical schemes.

The present disclosure provides a method for manufacturing an organic light-emitting diode (OLED) light-emitting material, comprising:
 a step S10 of mixing a first solvent with a host light-emitting material to form a first solution;
 a step S20 of mixing a second solvent with a dopant light-emitting material to form a second solution;
 a step S30 of mixing the first solution with the second solution to form a mixed solution;
 a step S40 of performing a gelling treatment for the mixed solution to form a dry gel; and
 a step S50 of performing a drying treatment for the dry gel to form the OLED light-emitting material, wherein the drying treatment for the dry gel is performed at a temperature of 100° C., and the drying treatment for the dry gel is performed for a duration of 8-10 hours.

In at least one preferred embodiment of the present disclosure, the first solvent is a solution prepared by mixing anhydrous ethanol with polyethylene glycol, the host light-emitting material is a carbazole derivative, the second solvent is anhydrous ethanol, and the dopant light-emitting material is a carbazole derivative.

In at least one preferred embodiment of the present disclosure, in the step S10, the host light-emitting material is added into the first solvent first, and then the host light-emitting material and the first solvent are well mixed by stirring.

In at least one preferred embodiment of the present disclosure, in the step S20, the dopant light-emitting material is added into the second solvent first, and then the dopant light-emitting material and the second solvent are well mixed by stirring.

In addition, the present disclosure provides a method for manufacturing an organic light-emitting diode (OLED) light-emitting material, comprising:
 a step S10 of mixing a first solvent with a host light-emitting material to form a first solution;
 a step S20 of mixing a second solvent with a dopant light-emitting material to form a second solution;
 a step S30 of mixing the first solution with the second solution in a glove box that is filled with a protective gas to form a mixed solution;
 a step S40 of putting the mixed solution into a reactor in which the mixed solution is treated at 40-60° C. for 18-36 hours to obtain a reaction solution;
 a step S50 of centrifuging the reaction solution and collecting a precipitate generated thereby; and
 a step S60 of putting the precipitate into a drying box that is filled with a protective gas to dry the precipitate and to obtain the OLED light-emitting material.

In at least one preferred embodiment of the present disclosure, the first solvent is a solution prepared by mixing anhydrous ethanol with polyethylene glycol, the host light-emitting material is a carbazole derivative, the second solvent is anhydrous ethanol, and the dopant light-emitting material is a carbazole derivative.

In at least one preferred embodiment of the present disclosure, in the step S10, the host light-emitting material is added into the first solvent first, and then the host light-emitting material and the first solvent are well mixed by stirring.

In at least one preferred embodiment of the present disclosure, in the step S30, the first solution and the second solution are mixed in a PTFE lining, and the mixed solution in the PTFE lining occupies 75-80% of an interior volume enclosed by the PTFE lining.

In at least one preferred embodiment of the present disclosure, before the step S30, the method further comprises:
 vacuumizing the drying box and the glove box, and filling the drying box and the glove box with the protective gas, wherein the protective gas is selected from a nitrogen gas, a helium gas, an argon gas, or any combination thereof.

Furthermore, the present disclosure provides a method for manufacturing an organic light-emitting diode (OLED) light-emitting material, comprising:
 a step S10 of mixing a first solvent with a host light-emitting material to form a first solution;
 a step S20 of mixing a second solvent with a dopant light-emitting material to form a second solution;

a step S30 of mixing the first solution with the second solution to form a mixed solution;

a step S40 of performing a gelling treatment for the mixed solution to form a dry gel; and a step S50 of performing a drying treatment for the dry gel to form the OLED light-emitting material.

In at least one preferred embodiment of the present disclosure, the first solvent is a solution prepared by mixing anhydrous ethanol with polyethylene glycol, the host light-emitting material is a carbazole derivative, the second solvent is anhydrous ethanol, and the dopant light-emitting material is a carbazole derivative.

In at least one preferred embodiment of the present disclosure, in the step S10, the host light-emitting material is added into the first solvent first, and then the host light-emitting material and the first solvent are well mixed by stirring.

In at least one preferred embodiment of the present disclosure, in the step S20, the dopant light-emitting material is added into the second solvent first, and then the dopant light-emitting material and the second solvent are well mixed by stirring.

According to the present disclosure, the host light-emitting material and the dopant light-emitting material are mixed uniformly and well, so as to obtain a material that has been treated for forming the light-emitting layer. Compared to the prior art where the dopant light-emitting material is deposited directly onto the host light-emitting material, vapor deposition of the host light-emitting material and the dopant light-emitting material can be performed based on component ratio that is predetermined before vapor deposition is carried out, balanced ratio of dopant material to host material during vapor deposition can be controlled. According to the present disclosure, the most optimal doping ratio that is predetermined before vapor deposition is carried out does not change during vapor deposition, mitigating adverse influence on the light-emitting efficiency of the light-emitting layer and overcoming the low light-emitting efficiency problem in the prior art.

BRIEF DESCRIPTION OF DRAWINGS

To explain in detail the technical schemes of the embodiments or existing techniques, drawings that are used to illustrate the embodiments or existing techniques are provided. The illustrated embodiments are just a part of those of the present disclosure. It is easy for any person having ordinary skill in the art to obtain other drawings without labor for inventiveness.

DETAILED DESCRIPTION

Figure 1:
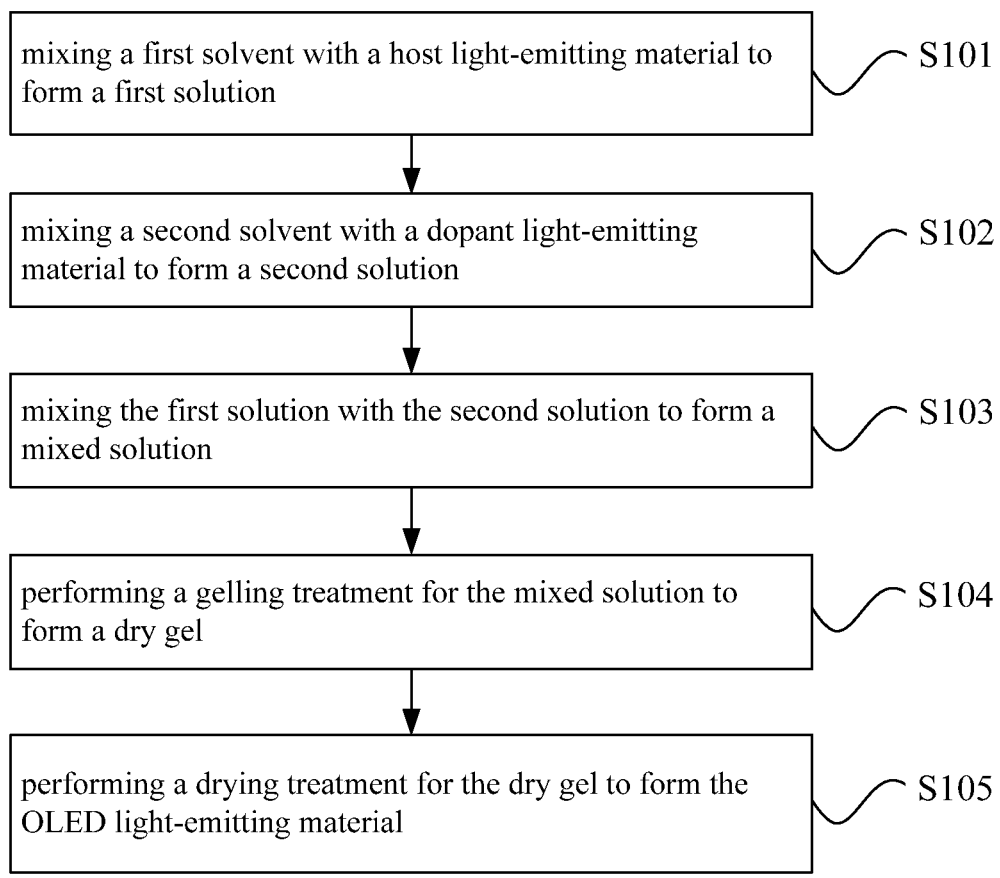
FIG. 1 is a schematic diagram showing a flowchart of a method for manufacturing an OLED light-emitting material according embodiment 1 of the present disclosure.

The following embodiments refer to the accompanying drawings for exemplifying specific implementable embodiments of the present disclosure. Moreover, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto. In the drawings, the same reference symbol represents the same or similar components.

The present disclosure provides a method for manufacturing an organic light-emitting diode (OLED) light-emitting material which solves the problems encountered by the prior art, where unbalanced ratio of dopant material to host material occurs during vapor deposition thereof, resulting in change of doping ratio of dopant material to host material in the light-emitting materials, and lowering light-emitting efficiency of light-emitting layer.

Embodiment 1

As shown in FIG. 1, the present disclosure provides a method for manufacturing an organic light-emitting diode (OLED) light-emitting material, including:

a step S101 of mixing a first solvent with a host light-emitting material to form a first solution;

a step S102 of mixing a second solvent with a dopant light-emitting material to form a second solution;

a step S103 of mixing the first solution with the second solution to form a mixed solution;

a step S104 of performing a gelling treatment for the mixed solution to form a dry gel; and a step S105 of performing a drying treatment for the dry gel to form the OLED light-emitting material.

The host light-emitting material is a carbazole derivative. The host light-emitting material could be mCP (1,3-Di(9H-carbazol-9-yl)benzene). The mCP has a chemical formula of:

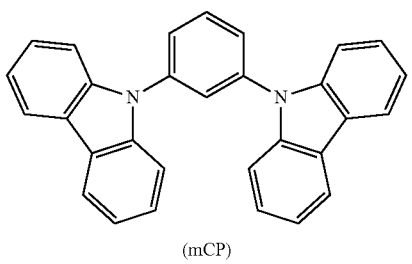 [SMILES: c1cc(-n2c3ccccc3c3ccccc32)cc(-n2c3ccccc3c3ccccc32)c1]

(mCP)

The dopant light-emitting material is a carbazole derivative. The dopant light-emitting material includes a donor material and an acceptor material. The donor material could be DMOC (3,6-diMethoxy-9H-carbazole), DMAC (9,9-DIMETHYL-9,10-DIHYDRO-ACRIDINE), or carbazole. The acceptor could be DPS (Diphenylsulfo) or BP (4,4'-Dimethylbenzophenone). The dopant light-emitting material could be DPS-DMOC, DPS-DMAC, BP-DMOC, or BP-DMAC. The donor material has a chemical formula of:

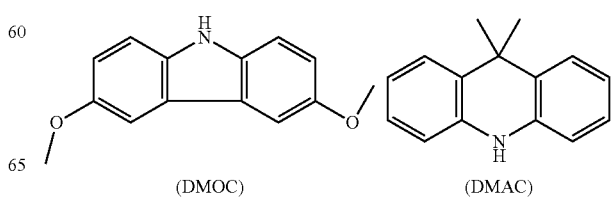

(DMOC)  (DMAC)

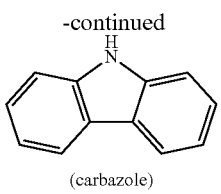

(carbazole)

The acceptor material has a chemical formula of:

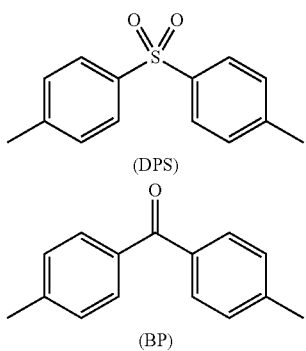

(DPS)

(BP)

In the present embodiment, the host light-emitting material is mCP, and the dopant light-emitting material is BP-DMAC.

Before vacuum vapor deposition is carried out, it is determined that the most optimal ratio of dopant light-emitting material to host light-emitting material is 3%, which can have the light-emitting layer have the highest light-emitting efficiency. Therefore, based on such doping ratio, 5 g of mCP (host light-emitting material), 0.15 g of BP-DMAC (dopant light-emitting material), 30 ml of anhydrous ethanol, and 10 ml of polyethylene glycol are prepared first.

Next, 10 ml of anhydrous ethanol and 10 ml of polyethylene glycol are mixed to form 20 ml of the first solvent. And, 20 ml of anhydrous ethanol is used to form 20 ml of the second solvent.

In the step S101, 5 g of mCP is added into 20 ml of the first solvent. After well mixed by stirring for 10 min using a magnetic stirrer, the first solution is obtained.

In the step S102, 0.15 g of BP-DMAC is added into 20 ml of the second solvent. After well mixed by stirring for 10 min using the magnetic stirrer, the second solution is obtained.

In the step S103, under the normal temperature, the first solution is slowly dropped into the second solution to obtain the mixed solution, wherein the dropping speed is controlled at 2 drops/sec. If the dropping process is too fast, there would be a precipitate generated in the mixed solution, which makes it difficult to form a gel, and the first solution and the second solution are not well mixed.

In the step S104, this step includes forming a gel from the mixed solution first, then forming the wet gel from the gel, and finally forming the dry gel from the wet gel.

Specifically, the mixed solution is put into a water bath with constant temperature of 50° C., and is heated and is stirred until a uniformly stable gel is formed. Then, the gel is aged for 1 hour, and after precipitation is completed, the wet gel is obtained. Finally, the wet gel is set still for 12-24 hours, and after the first solvent and the solvent evaporate, the dry gel is obtained.

In the step S105, to prevent water or oxidizing material in air from influencing the light-emitting materials, it is preferred to put the dry gel into a dry box, which is filled with a protective gas, to perform a drying treatment. This will further remove the solvent and the second solvent remained in the dry gel. Preferably, the drying treatment for the dry gel is performed at a temperature of 100° C., and the drying treatment for the dry gel is performed for a duration of 8-10 hours.

Before the step S105, the method further includes vacuumizing the drying box, and filling the drying box with a nitrogen gas as the protective gas.

Embodiment 2

Figure 2:
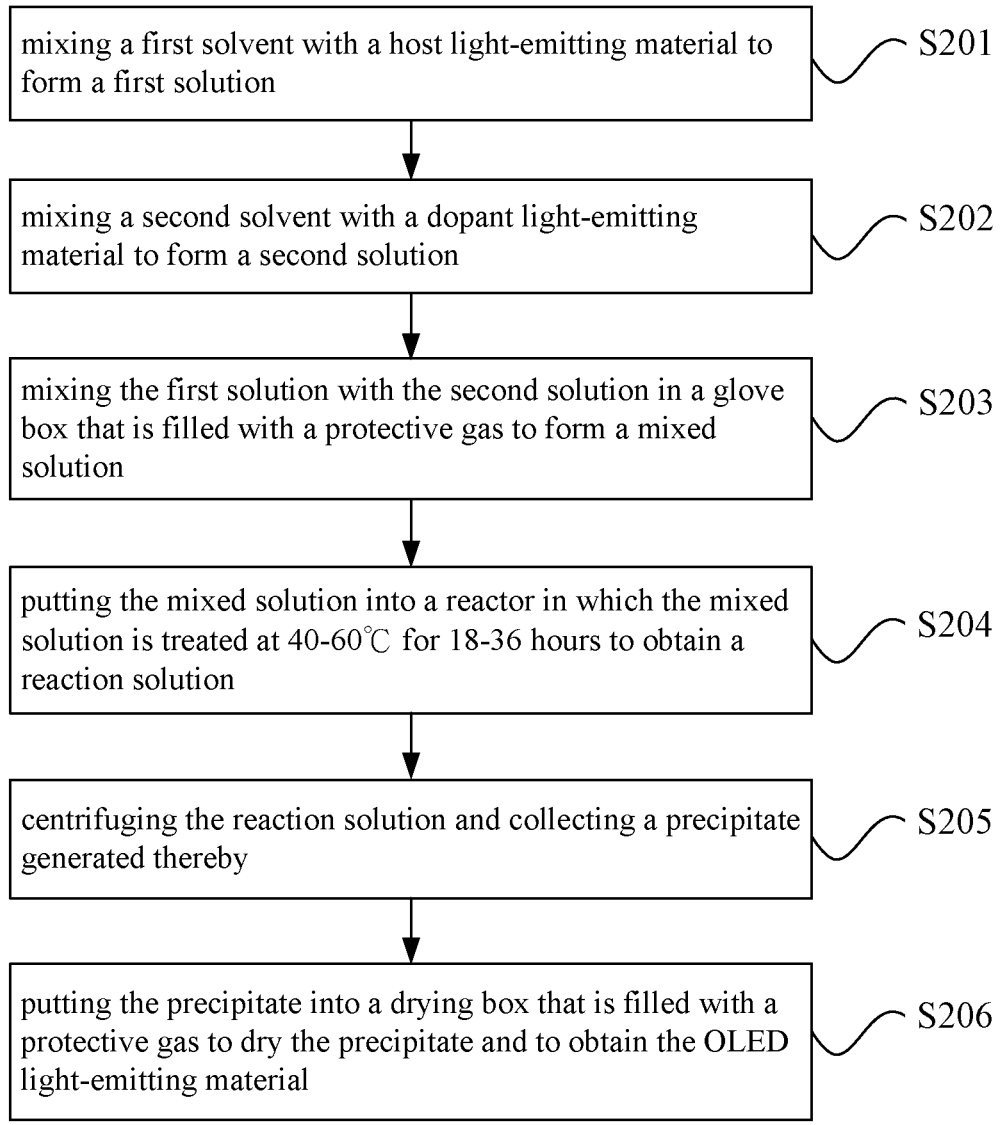
FIG. 2 is a schematic diagram showing a flowchart of a method for manufacturing an OLED light-emitting material according embodiment 2 of the present disclosure.

As shown in FIG. 2, the present disclosure provides a method for manufacturing an organic light-emitting diode (OLED) light-emitting material, including:
  a step S201 of mixing a first solvent with a host light-emitting material to form a first solution;
  a step S202 of mixing a second solvent with a dopant light-emitting material to form a second solution;
  a step S203 of mixing the first solution with the second solution to form a mixed solution;
  a step S204 of putting the mixed solution into a reactor in which the mixed solution is treated at 40-60° C. for 18-36 hours to obtain a reaction solution;
  a step S205 of centrifuging the reaction solution and collecting a precipitate generated thereby; and
  a step S60 of putting the precipitate into a vacuum drying box to obtain the OLED light-emitting material.

The host light-emitting material is a carbazole derivative. The host light-emitting material could be mCP (1,3-Di(9H-carbazol-9-yl)benzene). The mCP has a chemical formula of:

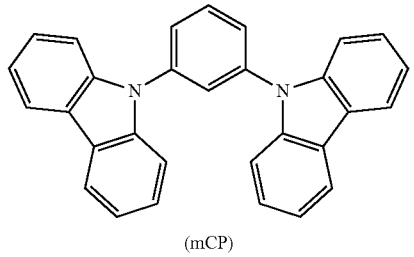 [SMILES: c1cc(-n2c3ccccc3c3ccccc32)cc(-n2c3ccccc3c3ccccc32)c1]

(mCP)

The dopant light-emitting material is a carbazole derivative. The dopant light-emitting material includes a donor material and an acceptor material. The donor material could be DMOC (3,6-diMethoxy-9H-carbazole), DMAC (9,9-DIMETHYL-9,10-DIHYDRO-ACRIDINE), 9,10-dihydro-9,9-dimethyl acridine, or carbazole. The acceptor could be DPS (Diphenylsulfo) or BP (4,4'-Dimethylbenzophenone). The dopant light-emitting material could be DPS-DMOC, DPS-DMAC, BP-DMOC, or BP-DMAC. The donor material has a chemical formula of:

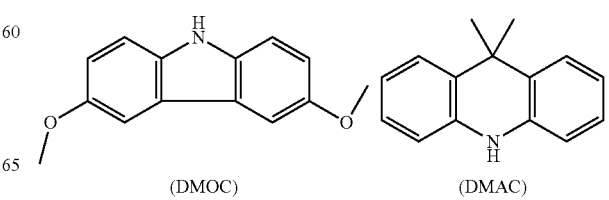

(DMOC)                    (DMAC)

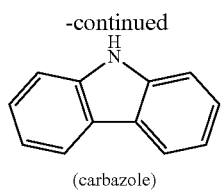

(carbazole)

The acceptor material has a chemical formula of:

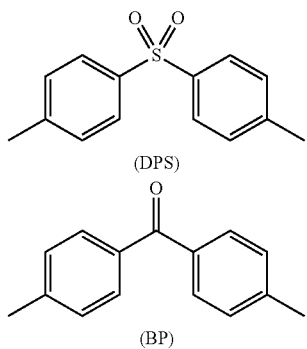

(DPS)

(BP)

In the present embodiment, the host light-emitting material is mCP, and the dopant light-emitting material is DPS-DMAC.

Before vacuum vapor deposition is carried out, it is determined that the most optimal ratio of dopant light-emitting material to host light-emitting material is 3%, which can have the light-emitting layer have the highest light-emitting efficiency. Therefore, based on such doping ratio, 5 g of mCP (host light-emitting material), 0.15 g of DPS-DMAC (dopant light-emitting material), 30 ml of anhydrous ethanol, and 10 ml of polyethylene glycol are prepared first.

Next, 10 ml of anhydrous ethanol and 10 ml of polyethylene glycol are mixed to form 20 ml of the first solvent. And, 20 ml of anhydrous ethanol is used to form 20 ml of the second solvent.

In addition, the reactor and the lining are put into the glove box in advance. The glove box and the drying box are vacuumized, and are filled with a nitrogen gas, so as to establish an environment of the glove box that is filled with the protective gas.

In the step S203, in the glove box that is filled with the protective gas, the second solution is added into the PTFE lining. Then, the first solution is dropped into the second solution. After being well mixed, the mixed solution is obtained. The mixed solution in the PTFE lining occupies 75-80% of an interior volume enclosed by the PTFE lining. That is, a volume of the mixed solution is 75-80% of the interior volume enclosed by the PTFE lining. Preferably, the mixed solution in the PTFE lining occupies 80% of the interior volume enclosed by the PTFE lining.

In the step S204, a high pressure reactor is used as the reactor. The temperature of the high pressure reactor cannot be too high, because a too high temperature cannot make the first light-emitting material and the second light-emitting material to be evaporated efficiently, and the light-emitting layer cannot be formed by vapor deposition. The mixed solution cannot be treated for a too long duration as well, because a long time duration would influence the following vapor deposition step. Preferably, the mixed solution is treated at 40-55° C., and the mixed solution is treated for a duration of 20-30 hours.

In the step S205, the reaction solution is centrifuged in a centrifuge. The rotation speed of the centrifuging step is controlled at 8000-10000 r/min, and the reaction solution is centrifuged for a duration of 5-20 min.

According to the present disclosure, the present disclosure provides a method for manufacturing an OLED light-emitting material. The host light-emitting material and the dopant light-emitting material are mixed uniformly and well, so as to obtain a material that has been treated for forming the light-emitting layer. Compared to the prior art where the dopant light-emitting material is deposited directly onto the host light-emitting material, vapor deposition of the host light-emitting material and the dopant light-emitting material can be performed based on component ratio that is predetermined before vapor deposition is carried out, balanced ratio of dopant material to host material during vapor deposition can be controlled. According to the present disclosure, the most optimal doping ratio that is predetermined before vapor deposition is carried out does not change during vapor deposition, mitigating adverse influence on the light-emitting efficiency of the light-emitting layer and overcoming the low light-emitting efficiency problem in the prior art.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. A method for manufacturing an organic light-emitting diode (OLED) light-emitting material, comprising:
    a step S10 of mixing a first solvent with a host light-emitting material to form a first solution;
    a step S20 of mixing a second solvent with a dopant light-emitting material to form a second solution;
    a step S30 of mixing the first solution with the second solution to form a mixed solution;
    a step S40 of performing a gelling treatment for the mixed solution to form a dry gel; and
    a step S50 of performing a drying treatment for the dry gel to form the OLED light-emitting material, wherein the drying treatment for the dry gel is performed at a temperature of 100° C., and the drying treatment for the dry gel is performed for a duration of 8-10 hours.

2. The method for manufacturing the OLED light-emitting material according to claim 1, wherein the first solvent is a solution prepared by mixing anhydrous ethanol with polyethylene glycol, the host light-emitting material is a carbazole derivative, the second solvent is anhydrous ethanol, and the dopant light-emitting material is a carbazole derivative.

3. The method for manufacturing the OLED light-emitting material according to claim 1, wherein in the step S10, the host light-emitting material is added into the first solvent first, and then the host light-emitting material and the first solvent are well mixed by stirring.

4. The method for manufacturing the OLED light-emitting material according to claim 1, wherein in the step S20, the dopant light-emitting material is added into the second solvent first, and then the dopant light-emitting material and the second solvent are well mixed by stirring.

5. A method for manufacturing an organic light-emitting diode (OLED) light-emitting material, comprising:
- a step S10 of mixing a first solvent with a host light-emitting material to form a first solution;
- a step S20 of mixing a second solvent with a dopant light-emitting material to form a second solution;
- a step S30 of mixing the first solution with the second solution in a glove box that is filled with a protective gas to form a mixed solution;
- a step S40 of putting the mixed solution into a reactor in which the mixed solution is treated at 40-60° C. for 18-36 hours to obtain a reaction solution;
- a step S50 of centrifuging the reaction solution and collecting a precipitate generated thereby; and
- a step S60 of putting the precipitate into a drying box that is filled with a protective gas to dry the precipitate and to obtain the OLED light-emitting material.

6. The method for manufacturing the OLED light-emitting material according to claim 5, wherein the first solvent is a solution prepared by mixing anhydrous ethanol with polyethylene glycol, the host light-emitting material is a carbazole derivative, the second solvent is anhydrous ethanol, and the dopant light-emitting material is a carbazole derivative.

7. The method for manufacturing the OLED light-emitting material according to claim 5, wherein in the step S10, the host light-emitting material is added into the first solvent first, and then the host light-emitting material and the first solvent are well mixed by stirring.

8. The method for manufacturing the OLED light-emitting material according to claim 5, wherein in the step S30, the first solution and the second solution are mixed in a PTFE lining, and the mixed solution in the PTFE lining occupies 75-80% of an interior volume enclosed by the PTFE lining.

9. The method for manufacturing the OLED light-emitting material according to claim 5, wherein before the step S30, the method further comprises:
vacuumizing the drying box and the glove box, and filling the drying box and the glove box with the protective gas, wherein the protective gas is selected from a nitrogen gas, a helium gas, an argon gas, or any combination thereof.

10. A method for manufacturing an organic light-emitting diode (OLED) light-emitting material, comprising:
- a step S10 of mixing a first solvent with a host light-emitting material to form a first solution;
- a step S20 of mixing a second solvent with a dopant light-emitting material to form a second solution;
- a step S30 of mixing the first solution with the second solution to form a mixed solution;
- a step S40 of performing a gelling treatment for the mixed solution to form a dry gel; and
- a step S50 of performing a drying treatment for the dry gel to form the OLED light-emitting material.

11. The method for manufacturing the OLED light-emitting material according to claim 10, wherein the first solvent is a solution prepared by mixing anhydrous ethanol with polyethylene glycol, the host light-emitting material is a carbazole derivative, the second solvent is anhydrous ethanol, and the dopant light-emitting material is a carbazole derivative.

12. The method for manufacturing the OLED light-emitting material according to claim 10, wherein in the step S10, the host light-emitting material is added into the first solvent first, and then the host light-emitting material and the first solvent are well mixed by stirring.

13. The method for manufacturing the OLED light-emitting material according to claim 10, wherein in the step S20, the dopant light-emitting material is added into the second solvent first, and then the dopant light-emitting material and the second solvent are well mixed by stirring.

* * * * *

UNITED STATES PATENT AND TRADEMARK OFFICE
CERTIFICATE OF CORRECTION

| | | |
|---|---|---|
| PATENT NO. | : 10,868,259 B2 | Page 1 of 1 |
| APPLICATION NO. | : 16/091116 | |
| DATED | : December 15, 2020 | |
| INVENTOR(S) | : Guoxia Yi | |

It is certified that error appears in the above-identified patent and that said Letters Patent is hereby corrected as shown below:

On the Title Page

Item (30) should be added as follows:
Foreign Application Priority Data
May. 30, 2018 (CN)...................... 201810536530.6

Signed and Sealed this
Seventh Day of March, 2023

*Katherine Kelly Vidal*

Katherine Kelly Vidal
*Director of the United States Patent and Trademark Office*